United States Patent
Flannery et al.

(10) Patent No.: US 10,034,403 B1
(45) Date of Patent: Jul. 24, 2018

(54) CARD RETAINER DEVICE

(71) Applicant: ADVANCED COOLING TECHNOLOGIES, INC., Lancaster, PA (US)

(72) Inventors: Matt D. Flannery, Stevens, PA (US); James E. Schmidt, Morgantown, PA (US); Jens E. Weyant, Hershey, PA (US); Scott D. Garner, Lititz, PA (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 20 days.

(21) Appl. No.: 15/454,733

(22) Filed: Mar. 9, 2017

(51) Int. Cl.
| H05K 7/14 | (2006.01) |
| H05K 7/20 | (2006.01) |
| H05K 7/12 | (2006.01) |
| F16B 2/06 | (2006.01) |
| F16B 2/14 | (2006.01) |

(52) U.S. Cl.
CPC .......... *H05K 7/1418* (2013.01); *F16B 2/065* (2013.01); *F16B 2/14* (2013.01); *H05K 7/12* (2013.01); *H05K 7/2039* (2013.01)

(58) Field of Classification Search
CPC combination set(s) only.
See application file for complete search history.

(56) References Cited

U.S. PATENT DOCUMENTS

| 3,971,186 A * | 7/1976 | Havelka ................. F16B 2/14 403/374.4 |
| 4,318,157 A * | 3/1982 | Rank .................. H05K 7/20545 361/704 |
| 4,751,963 A * | 6/1988 | Bui ....................... H05K 7/1404 165/80.2 |
| 4,775,260 A * | 10/1988 | Kecmer .................... F16B 2/14 361/801 |
| 4,819,713 A * | 4/1989 | Weisman ............. H05K 7/1404 165/80.2 |
| 4,823,951 A * | 4/1989 | Colomina ............ H05K 7/1404 206/707 |
| 4,824,303 A * | 4/1989 | Dinger ...................... F16B 2/14 254/104 |
| 4,909,752 A * | 3/1990 | Hallum .............. H01R 12/7005 361/752 |

(Continued)

FOREIGN PATENT DOCUMENTS

| EP | 0289686 A1 | 5/1987 |
| EP | 0461909 A2 | 6/1991 |

*Primary Examiner* — Daniel J Wiley
(74) *Attorney, Agent, or Firm* — McNees Wallace & Nurick LLC

(57) ABSTRACT

A card retainer device for securing a card module in a channel of a chassis. The card retainer device includes wedge members which have main portions with integrated brackets integrally attached to the main portions, the integrated brackets form first L-shaped brackets which engage walls of the chassis, surfaces of the card module or a combination thereof. The L-shaped brackets provide bearing surfaces which reduces binding and wear when the card retainer device secures the card module in the channel of a chassis and enhances the conductance of heat through the card retainer device. The wedge members provide heat transfer paths between the card module and the chassis. Mating surfaces of mating wedge member interfaces have compound angles that produces an applied force orthogonal to a flange of the conduction card that is greater than the force applied parallel to the flange of the conduction card.

18 Claims, 8 Drawing Sheets

(56) References Cited

U.S. PATENT DOCUMENTS

| | | | | |
|---|---|---|---|---|
| 5,057,968 A * | 10/1991 | Morrison | H05K 7/1404 | 165/104.33 |
| 5,071,013 A * | 12/1991 | Peterson | H05K 7/1404 | 211/26 |
| 5,090,840 A * | 2/1992 | Cosenza | H05K 7/1404 | 361/759 |
| 5,156,647 A * | 10/1992 | Ries | H05K 7/1404 | 403/409.1 |
| 5,224,016 A * | 6/1993 | Weisman | H05K 7/1404 | 165/80.1 |
| 5,253,963 A * | 10/1993 | Ries | H05K 7/1404 | 403/409.1 |
| 5,290,122 A * | 3/1994 | Hulme | H05K 7/1404 | 165/80.2 |
| 5,407,297 A * | 4/1995 | Hulme | H05K 7/1404 | 403/24 |
| 5,483,420 A * | 1/1996 | Schiavini | H05K 7/1404 | 211/41.17 |
| 5,607,273 A * | 3/1997 | Kecmer | H05K 7/1404 | 411/24 |
| 5,711,628 A * | 1/1998 | Fletcher | F16B 2/04 | 403/31 |
| 5,779,388 A * | 7/1998 | Yamamoto | H05K 7/1404 | 361/741 |
| 6,285,564 B1 | 9/2001 | O'Brien | | |
| 6,687,130 B2 * | 2/2004 | Adams, Sr. | H05K 7/1404 | 361/174 |
| 6,707,670 B2 * | 3/2004 | Seal | F16B 2/14 | 174/535 |
| 7,349,221 B2 * | 3/2008 | Yurko | H05K 7/1404 | 165/80.2 |
| 7,883,289 B2 * | 2/2011 | Weisman | H05K 7/1407 | 403/374.4 |
| 8,743,544 B2 | 6/2014 | Monson et al. | | |
| 8,967,903 B1 | 3/2015 | Sharfi | | |
| 2010/0002395 A1 | 1/2010 | Bertrou et al. | | |
| 2011/0150568 A1 | 6/2011 | Deisenhofer | | |
| 2013/0003316 A1 | 1/2013 | Martin | | |

\* cited by examiner

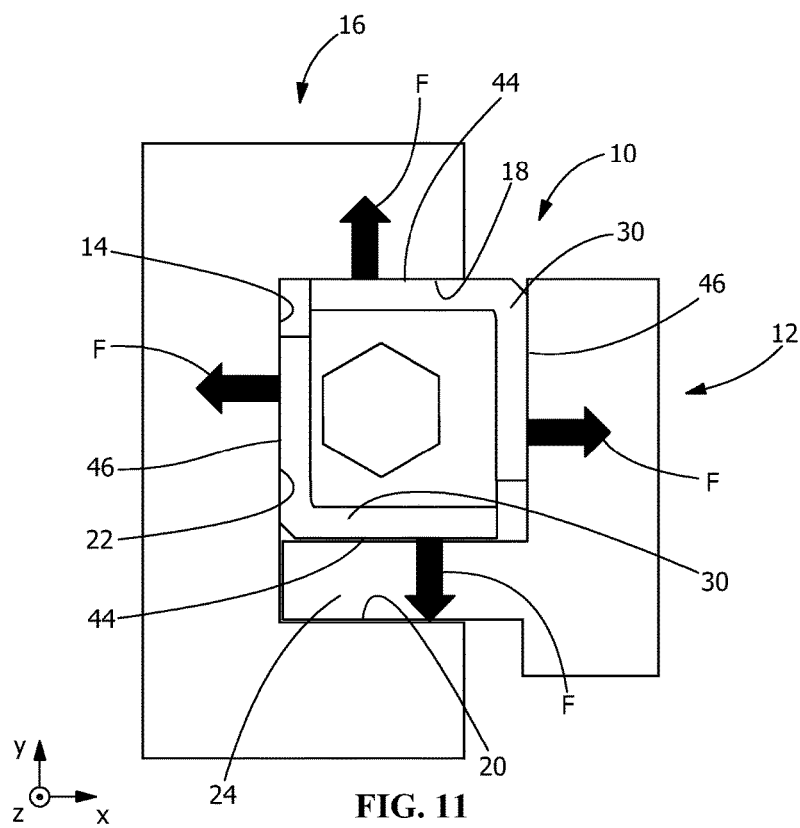
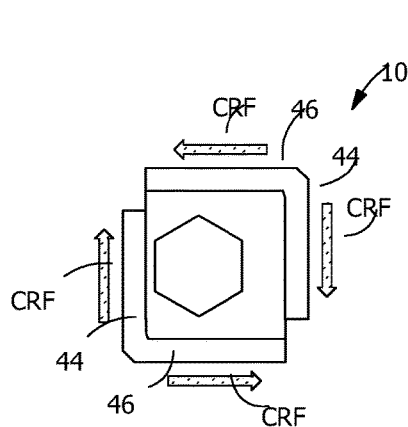
FIG. 12A
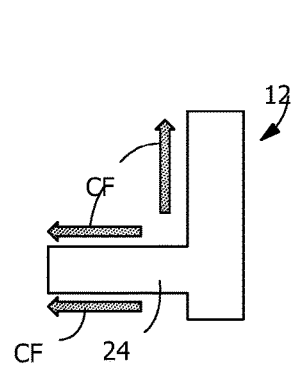
FIG. 12B
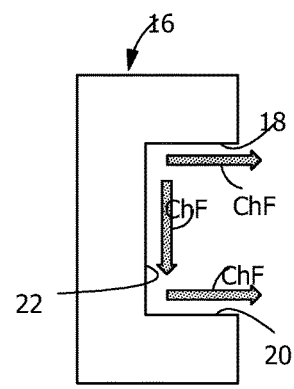
FIG. 12C

CARD RETAINER DEVICE

STATEMENT REGARDING FEDERALLY SPONSORED RESEARCH

This invention was made with Government support under Contract No. FA9453-15-C-0418, Thermal Enhancements for Separable Thermal Mechanical Interfaces, awarded by the Air Force. The Government has certain rights in the invention.

FIELD OF THE INVENTION

The invention is directed to a card retainer device which clamps a card module to a chassis. In particular, the invention is directed to a card retainer device in which the forces applied to the side-wall of the chassis are limited or minimized while providing maximum total surface area for heat transfer from the card module and the chassis.

BACKGROUND

Card retainer devices are used in "separable thermal-mechanical interfaces", or STMI's. Such STMI's are often used in ruggedized computer assemblies used in demanding environments, such as military and aerospace vehicles. The assemblies are composed of a chassis, electronics card modules and card retainers. The chassis is made with guiding features to accept several card modules, which are inserted and "plugged-in" to backplane electrical connectors. Card retainers are mounted on each card module and clamp the card into the chassis guides when actuated. Adoption of these assemblies has been widespread due to the inherent ease of maintenance and open architecture that encourages upgrades to systems as they become available. For the most part, these computer assemblies have been standardized by the VMEBus International Trade Association (VITA) which has developed rules and guidelines for the manufacture of chasses, cards and card retainers to ensure that products from industry vendors can successfully integrate to provide flexible computing solutions to developers.

Thermal management of the computer assemblies is currently approached in several ways. For very low power assemblies, no active thermal management is needed. However, due to the high density packaging and the enclosed air volume that the chassis creates, cooling by natural convection is limited. For higher power assemblies, forced air convection is used in which fans and vents are placed in the chassis walls to flow ambient air through the assembly, cooling the electronics by forced convection. This approach can be effective but is limited to applications which are low altitude, low ambient temperature and in non-contaminating environments. For the most demanding applications, the chassis is completely sealed, and the cards are designed to have higher in-plane thermal conductivity. Heat is conducted from the card mounted electronics to the STMI, where the card retainer clamps the card tab into the chassis guide. Heat is conducted through this interface to the chassis walls, which are externally cooled either by forced convection of air or by forced convection in the form of a coolant jacket. In applications where the enclosure is externally cooled, the thermal connection formed by the card retainer is a significant thermal resistance.

In recent years, computing requirements have become more demanding due to the focus on network-centric warfare, with the increased use of graphics, video, digital signal processing, sensor data acquisition and other computer-intensive tasks. As a result, computational power has increased and has generated challenging thermal management issues within standardized enclosures. Thus, to enable higher computational power, while maintaining component operating temperatures, efforts are needed to reduce thermal resistance.

One card retainer currently used to clamp is the wedge lock which has found acceptance in industry and is used in a large number of applications. The device achieves the desired card clamping force to retain the card in the chassis rails by actuating a series of trapezoidal "wedges". These wedges are hollowed and sit axially in a row along a threaded fastener and/or a guide. When the threaded fastener is turned, it advances the end wedge, and force is applied to the wedge interfaces causing outward motion of the wedges. The wedge lock is primarily designed as a clamp and enables card-to-chassis heat transfer by forcing the card and chassis faces into intimate contact. Since it was designed this way, the device itself is not made to be very thermally conductive.

Another known card retainer is the cardlock clamp shown in U.S. Pat. No. 8,743,544. The cardlock clamp is also a wedge-type device in which a pair of actuating bolts compresses a stack of wedges to provide outward wedge motion. The wedges are cut at compounded angles, allowing the retainer to expand in two directions. Unlike the previously mentioned wedge lock device, the wedges of the cardlock clamp do not make direct contact with the card and chassis themselves but are nested inside two L-shaped brackets which thermally connect the card and chassis. The thermal connection of the card and chassis enhances the thermal performance of the device by utilizing more of surface area to transfer heat. This helps lower heat flux by opening more paths for heat rejection from the conduction card to the chassis.

Despite the improvement in thermal performance, the cardlock clamp shown in U.S. Pat. No. 8,743,544 has shortcomings that limit its use. For example, the cardlock clamp achieves the aforementioned thermal enhancements by exerting force onto the side-walls of the chassis. Unfortunately, the chasses have not been designed to accept loading and can experience undesirable deflection, and possibly permanent deformation, when forces are applied.

It would, therefore, be beneficial to provide a card retainer device which provides for sufficient thermal transfer between a card module and a chassis while reducing or minimizing the forces applied to the chassis walls. It would also be beneficial to provide a card retainer device in which actuation may be achieved while only having access to a single side of the device.

SUMMARY

An object of the invention is to provide a card retainer device in which the forces applied to the side-wall of the chassis are limited or minimized while providing the maximum surface area possible for heat transfer from a card module to the chassis.

An embodiment is directed to a card retainer having first and second type wedge members with a tightening element which may actuate the retainer assembly.

An embodiment is directed to a card retainer having first and second wedge members with a tightening element and brackets encapsulating the wedge members.

An embodiment is directed to a card retainer having first and second wedge members with a tightening element and bracket extensions machined into the wedge members.

An embodiment is directed to a card retainer device for securing a card module in a channel of a chassis. The card retainer device includes first wedge members and second wedge members. The first wedge members are positioned at the ends of the card retainer device. The first wedge members have first main portions with first integrated brackets integrally attached to the first main portions, the first integrated brackets form first L-shaped brackets which engage walls of the chassis, surfaces of the card module or a combination thereof. The second wedge members are positioned between the first wedge members. The second wedge members have second main portions with second integrated brackets integrally attached to the second main portions, the second integrated brackets form second L-shaped brackets which engage walls of the chassis, surfaces of the card module or a combination thereof. The first and second L-shaped brackets provide bearing surfaces which reduces binding and wear when the card retainer device secures the card module in the channel of a chassis and enhances the conductance of heat through the card retainer device.

An embodiment is directed to a card retainer assembly having a chassis, a card module and a card retainer device. The chassis has a channel for receiving a card module and a card retainer device therein. The channel has a slot extending from a surface of the channel. The card module has a flange which is received in the channel. The flange has a tab which is received in the slot. The card retainer device includes wedge members which exert force on the surfaces of the channels and the flange of the card module to retain the card module in the channel. When force is applied by the card retaining device to the surfaces of the channel and the flange, the tab engages the slot to generate a reaction force that limits the motion of the chassis relative to the tab, thereby minimizing the deflection of the surfaces of the channel.

An embodiment is directed to a card lock retainer assembly which includes wedge members. The wedge members have protrusions designed to produce heat transfer paths between a conduction card and a chassis. Mating surfaces of mating wedge member interfaces have compound angles that produces an applied force orthogonal to a flange of the conduction card that is greater than $1/\mu$ the force applied parallel to the flange of the conduction card, where $\mu$ is the friction factor between the mating surfaces of the mating wedge members within the card lock retainer assembly.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 11 is a schematic view of the card retainer device of FIG. 1 shown in engagement with a chassis and card module, illustrating the flow of heat and the force applied by the card retainer device.

FIGS. 12A, 12B and 12C are schematic views of the components of FIG. 6, illustrating the frictional components applied by each component.

DETAILED DESCRIPTION OF THE INVENTION

Figure 1:
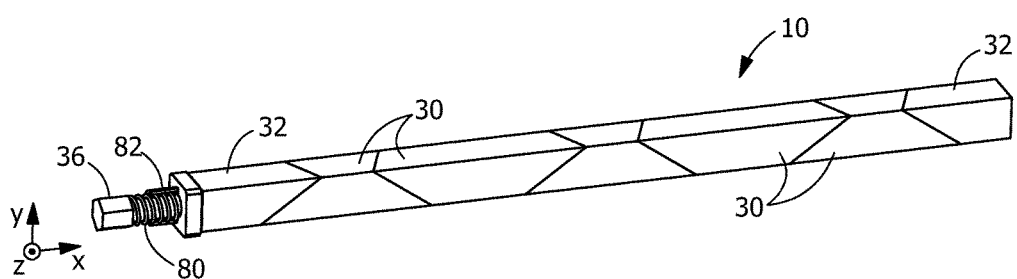
FIG. 1 is a perspective view of an illustrative first embodiment of a card retainer device of the present invention, the card retainer device is shown in a relaxed position.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In general, a card retainer device or clamp 10 is described that is used to secure a circuit card, conduction card or card module 12 in a channel 14 of a card cage or chassis 16, as shown in FIG. 11. The described card retainer device 10 converts an input compression force into clamping forces in at least two radial directions perpendicular to the compression force. The card retainer device 10 also provides selfalignment and self-center functions with respect to the circuit module 12 and the chassis 16. Further, the described card retainer device 10 provides a more effective means of transferring heat from the card module 12.

Referring to FIG. 11, an exemplary working environment for a card retainer device 10 is shown. The card retainer device 10 is configured to secure the card module 12 in the channel 14 of the chassis 16. The chassis 16 has at least one channel 14 extending along a z-direction. Each of the channels 14 is defined by a top surface or wall 18, a bottom surface or wall 20 and a side surface or wall 22. All the surfaces 18, 20, 22 of one channel 14 can be a heat sink for the card module 12 to be secured therein. The card module 12 has a flange 24 protruding from one end of the card module 12 into the channel 14. When the card module 12 is mated in the channel 14 of the chassis 16, the card retainer device 10 is disposed between the flange 24 and one of the side surfaces 18 of the channel 14 to clamp the card module 12 in the channel 14.

The card retainer device 10 is configured to convert an input compression force applied in the z-direction into clamping forces in four directions (as represented by arrows F), such as along the x-direction and the y-direction, simultaneously. The x-direction, the y-direction and the z-direction are perpendicular to each other. In the y-direction, the card retainer device 10 is expandable to make positive contact with the flange 24 of the card module 12 on one side and make positive contact with the top surfaces 18 of the channel 14 on the other side. At the same time, the flange 24 of the card module 12 is pushed by the card retainer device 10 to make positive contact with the other of the bottom surface 20 of the channel 14. In this manner, the card module 12 is secured by the card retainer device 10 in the channel 14 of the chassis 16. In the x-direction, the card retainer device 10 is also expandable to make positive contact with the card module 12 on one side and make positive contact with the side surface 22 of the channel 14 on the other side so that the card retainer device 10 is self-aligned and self-centered with respect to the card module 12 and the channel 14 of the chassis 16. Heat can be transferred from the card module 12 to the heat sink through the card retainer device 10.

Figure 2:
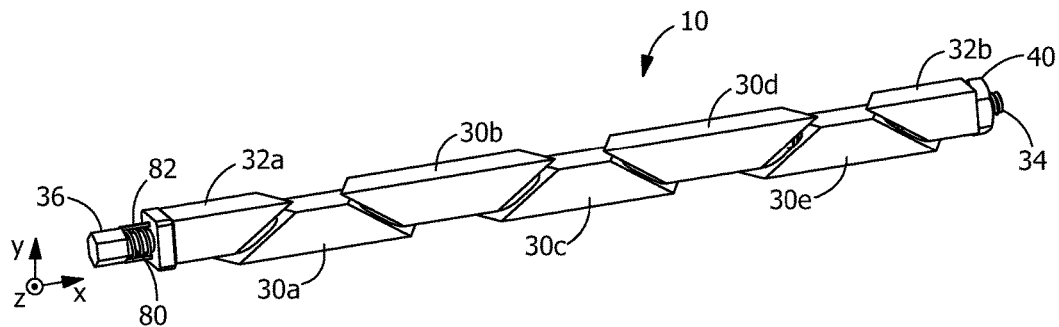
FIG. 2 is a perspective view of an illustrative first embodiment of the card retainer device, with wedge members shown in an extended or actuated position.
Figure 3:
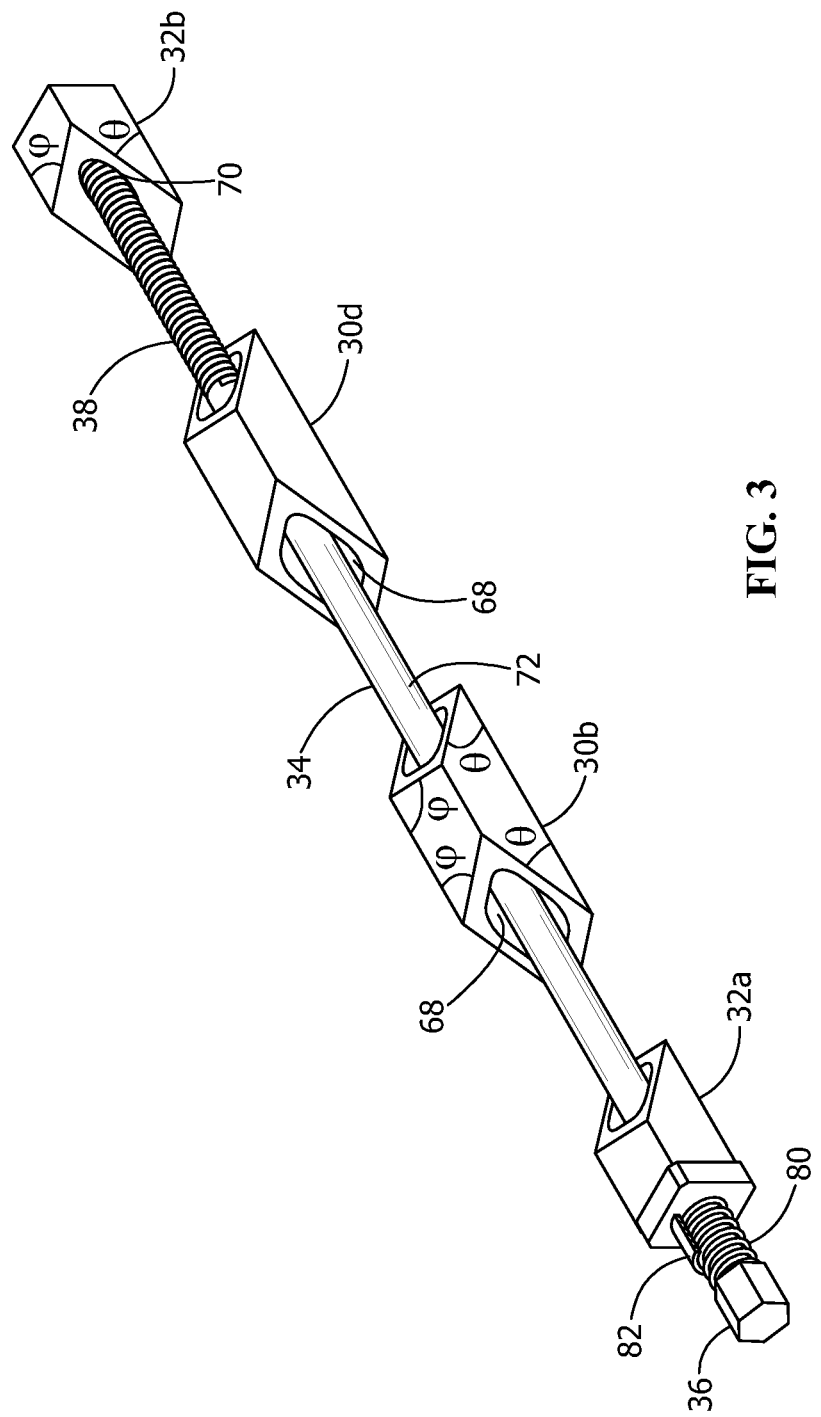
FIG. 3 is a perspective view of the card retainer device of FIG. 1, with various wedge members removed to shown the cooperation of the activation bolt with the wedge members.
Figure 4:
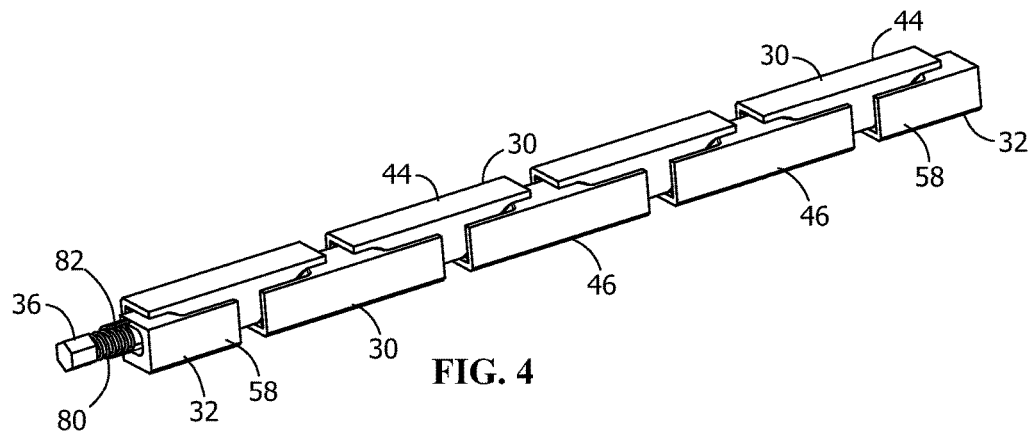
FIG. 4 is a perspective view of an illustrative third embodiment of a card retainer device of the present invention, the card retainer device is shown in a relaxed position.
Figure 5:
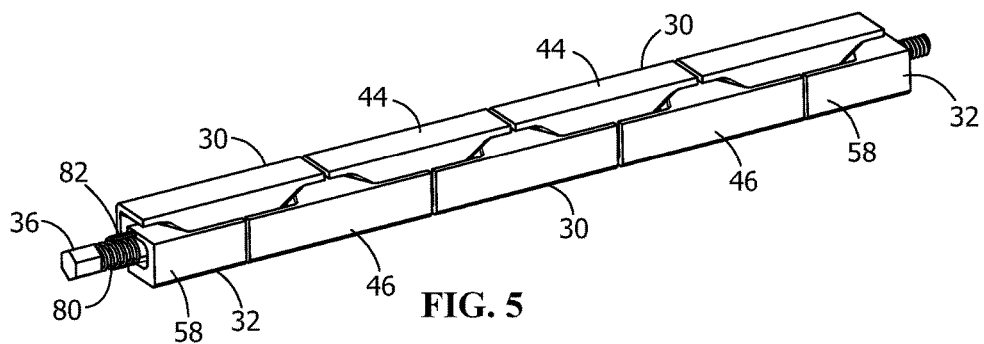
FIG. 5 is a perspective view of the card retainer device of FIG. 4, with wedge members shown in an extended or actuated position.

As best shown in FIGS. 1 through 3, a first illustrative embodiment of the card retainer device 10 includes multiple first wedge members 30 and multiple second wedge members 32. In the embodiment shown, five first wedge members 30 *a, b, c, d, e* and two second wedge members 32 *a, b* are shown. However, other numbers of wedge members 30, 32 may be used. The card retainer device 10 further includes a threaded or tightening element 34, such as a screw, which extends through the wedge members 30, 32. An engagement section 36 for manually rotating the tightening element 34 is provided at an end of the tightening element 34.

In the illustrative embodiment shown in FIG. 3, a threaded section 38 of the tightening element 34 engages an internally threaded element (for example in wedge member 32*b*) or a nut 40 (FIG. 1) for applying a pressure force between the engagement section 36 located at a forward end of the tightening element 34 and the threaded element in wedge member 32*b* or the nut 40 located at a rear end of the tightening element 34. The force applied by the tightening element 34 compresses the wedge members 30, 32 to cause a compression of said card retainer device 10 in z-direction along with an expansion thereof in both x- and y-directions.

Figure 7:
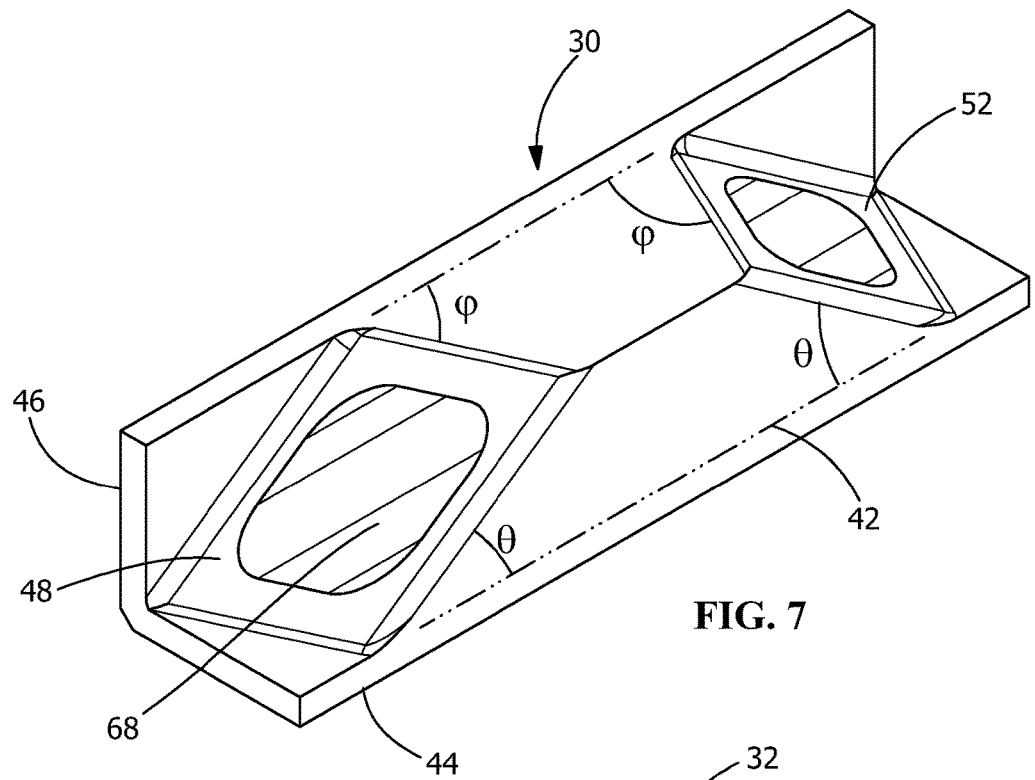
FIG. 7 is an enlarged perspective view of an illustrative full wedge used in the card retainer device of FIG. 4.
Figure 8:
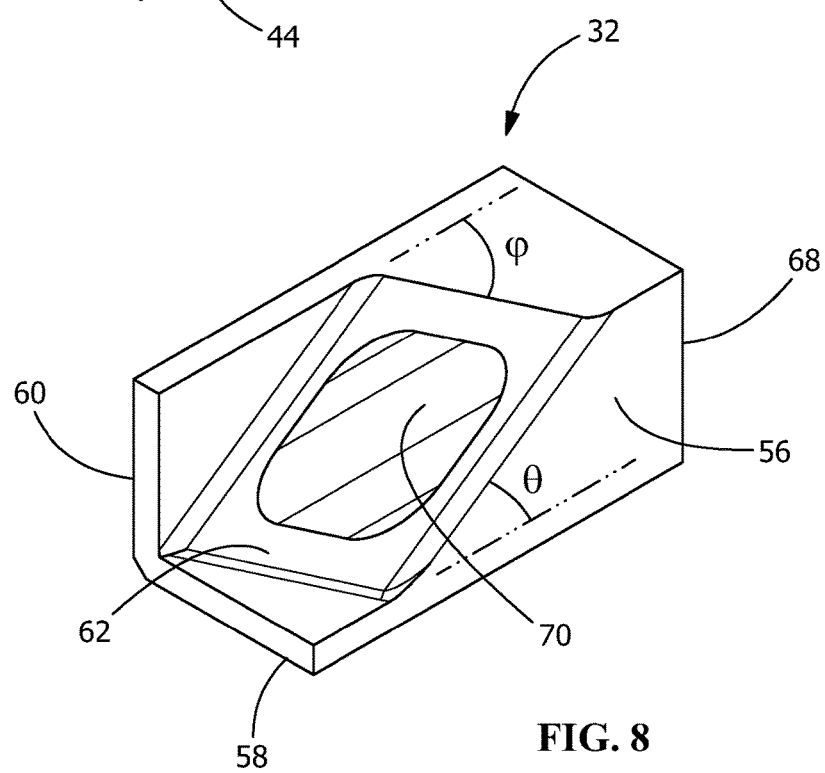
FIG. 8 is an enlarged perspective view of an illustrative full wedge used in the card retainer device of FIG. 4.

As best shown in FIG. 7, wedge members 30 have a substantially rectangular block shape main portion 42 with engaging surfaces 44, 46 extending from two sides of the main portion 42. A forward surface 48 of the main portion 42 of each wedge member 30 provides a frictional gliding surface which is angled with regard to both said y- and z-directions. A rearward surface 52 of the main portion 42 of each wedge member 30 also provides a frictional gliding surface which is angled with regard to both said x- and z-directions. The frictional gliding surfaces 48, 52 provide surfaces extending in a direction in which none of the x, y and z components of the surface normal vector equals zero. In the embodiment shown, the frictional gliding surface 48, 52 use angles in which the "wedging action" is stronger in the vertical direction. This allows for large friction force development, achieving friction locking at relatively low friction coefficients. In contrast to a symmetrical wedge in which friction coefficients ($\mu s$)>1.00 would be required to achieve friction locking, the frictional gliding surface 48, 52 of the present invention, with $\theta=35°$ and $\varphi=65°$, can achieve friction locking with $\mu s$>0.17. Low wedge-to-wedge friction coefficients are desired such that output forces from the card retainer device 10 are high, but friction locking of the card module 12 to the chassis 16 is achieved.

Similarly, wedge members 32 have a substantially rectangular block shaped main portion 56 with engaging surfaces 58, 60 extending from two sides of the main portion 56. A forward surface 62 of the main portion 56 of each wedge member 32 provides a frictional gliding surface which is angled with regard to both said x- and z-directions. In other words, the frictional gliding surface 62 provides a surface extending in a direction in which none of the x, y and z components of the surface normal vector equals zero. In the embodiment shown, the frictional gliding surface 62 uses angles in which the "wedging action" is stronger in the vertical direction. This allows for large friction force development, achieving friction locking at relatively low friction coefficients. In contrast to a symmetrical wedge in which friction coefficients ($\mu s$)>1.00 would be required to achieve friction locking, the frictional gliding surface 62 of the present invention, with $\theta=35°$ and $\varphi=65°$, can achieve friction locking $\mu s$>0.17. Low wedge-to-wedge friction coefficients are desired such that output forces from the card retainer device 10 are high, but friction-locking of the card module 12 to the chassis 16 is achieved. Rearward end 66 of the main portion 56 of each of the wedge members 32 extends in a direction which is generally perpendicular to the longitudinal axis of the main portion 56.

It is advantageous from a thermal performance perspective to maximize the outward force applied the wedge members 30, 32 to the chassis 16 to reduce thermal interface resistances. However, the outward force applied to the chassis 16 by the wedge members 30, 32 may create an unacceptable deflection of the chassis 16. Thus, to achieve the maximum thermal performance without chassis deflection, the card retainer device 10 and system utilize the compound angles described to achieve a "friction locking" effect which minimizes side-wall deflection. The card retainer device 10 is configured such that the outward forces developed in the horizontal (toward side-wall) and vertical direction (perpendicular to side-wall) are different. This is achieved by varying the angles ($\theta$) and ($\varphi$) of the wedge members 30, 32. If the angles are chosen properly, the ratio of the force developed in the vertical direction and the force developed in the horizontal direction can create a "locking" which uses friction to resist separation of the flanges 24 of the card module 12 from the channel 14, as illustrated in FIGS. 12A, 12B and 12C. The arrows CRF in FIG. 12A represent the frictional forces related to the card retainer device 10. The arrows CF in FIG. 12B represent the frictional forces related to the card module 12. The arrows ChF in FIG. 12C represent the frictional forces related to the chassis 16.

The selection of wedge angles not only affects the strength of the locking effect, but also many other factors, including, but not limited to, the number of wedge members (i.e. mechanical advantage), the tightening element loading and the outward forces/contact pressure.

Locking the flange 24 to the chassis 16 increases the stiffness of the assembly. During operation, the flange 24 will be loaded in tension, making it resist the expansion of the chassis side-walls, thereby minimizing deflection to acceptable values.

As best shown in FIGS. 4 through 8, a second illustrative embodiment of the card retainer device 10 is shown. The card retainer device 10 and the wedge members 30, 32 operate in the same manner as described with respect to the embodiment shown in FIGS. 1 through 3. However, the wedge members 30, 32 shown in FIGS. 4 through 8 have bracket extensions or engaging surfaces 44, 46, 58, 60 which facilitate heat transfer and eliminate the need for separate L-brackets and wedge members. The wedge members 30 have essentially perpendicular engaging surfaces 44, 46 which form integrated brackets and which are configured to act as L-shaped extensions. The wedge members 32 have essentially perpendicular engaging surfaces 58, 60 which are configured to act as L-shaped extensions. The extensions or engaging surfaces 44, 46, 58, 60 are limited in their length by several factors, including wedge angles, wedge number and actuation range. The bracket extensions or engaging surfaces 44, 46, 58, 60 may be machined into the wedge members 30, 32.

The integration of extensions or engaging surfaces 44, 46, 58, 60 increases the cross-sectional area of the wedge members 30, 32 (for a given size retainer) available for heat transfer, improving heat transfer and reducing the temperature drop between the card and the chassis. The larger size also allows for thicker engaging surfaces 44, 46, 58, 60, which enhances the conductance of heat through the card retainer device 10.

In the embodiments shown in FIG. 2, each of the wedge members 30 has a central through bore or hole 68 extending in the z-direction. The shape of the bore or hole 68 may be, but is not limited to, rectangular or elliptical. Additionally, each of the wedge members 32 has a central cylindrical through bore or hole 70 extending in the z-direction. The through holes 68, 70 are configured to receive the tightening element 34 therein. The through holes 68, 70 have a diameter which is larger than the diameter of the tightening element 34, thereby allowing for clearance for lateral movements of the wedge members 30, 32 in the x- and z-directions in relation to the tightening element 34. Alternatively, as shown in FIG. 3, the bore or hole in one of the wedge members 32 may be threaded to accept the threaded section 38 of the tightening element 34.

The sizes and shapes of the through holes 68, 70 and the diameter of the tightening element 34 define the reach of the individual wedge members 30, 32 in x- and z-directions. Any other configurations allowing for a sufficient displacement of the wedge members 30, 32, leaving a sufficient remnant of the frictional gliding surfaces 50, 54, 64 and keeping the integrity and durability of the wedge members 30, 32 can be chosen instead.

The tightening element 34 may be integrated such that it is compressively loaded, "pushing bolt", or tensile loaded, "pulling bolt". A pulling bolt uses a bolt which must extend through the through holes 68, 70 of the wedge members 30, 32 as discussed above. With a pushing bolt, a single screw is used to compress the wedge members 30, 32, causing actuation. To accomplish this, some means of fixing the end wedge member 32b, opposite of the bolt, must be provided. For example, if the card retainer device 10 is housed within an L-bracket, the end wedge member movement may be fixed by closing the L-bracket at the end, such that when the bolt pushes the wedge members 30, 32 together, the wedge member 32b is forced into the stop machined into the L-bracket.

Actuation is achieved by compressing the wedge "stack" in the tightening element 34 axis direction, causing the wedge members 30, 32 to spring outward. The amount of wedge stack compression required to meet a specified actuation is a function of the wedge angles chosen with shallower angles requiring longer tightening element 34 travel. Shallower angles produce larger outward forces but due to the shortened wedge stack the forces are concentrated over a reduced area.

As previously stated, the slope of the frictional gliding surfaces 50, 54, 64 is sufficient to transform a compressive force in the y-direction applied by the tightening element 34 to the frictional gliding surfaces 50, 54, 64 of adjacent wedge members 30, 32 into a movement of the wedge elements in x- and/or z-directions in relation to one another in reaction to the compressive force.

When all of the wedge members 30, 32 have abutted in both x- and z-directions, a further expansion of the card retainer device 10 is not possible any more in neither x- nor z-direction, and the compression in the y-direction is blocked. The longitudinal compressive force applied by the tightening element 34 is now transformed into traverse forces in x- and z-directions applied by the wedge elements for achieving the clamping effect.

The engagement section 36, which is self-locking, is used to operate the tightening element 34 and will fix the card retainer device 10 in the locked position. Additionally, a spring element 80 compressed in series with the wedge members 30, 32 can be used to provide compressive force.

The card retainer device 10 applies force to the walls 18, 20, 22 of the channel 14 of the chassis 16 to maximize the total surface area for heat transfer. In order to limit deflection of the walls 18, 20, 22 to acceptable values the card retainer device 10 can be designed to deliver a precise and limited amount of force to the walls 18, 20, 22 of the channel 14 of the chassis 16. This can be achieved in a multitude of ways, many of which utilize a spring element 80 to achieve this effect.

A helical spring element 80 and spacer 82 may be included in the wedge stack and cooperate with respective wedge members 30, 32. The helical spring element 80 provides a compressive force and the spacer 82 limits the travel distance of the tightening element 34. When the tightening element 34 is turned, the helical spring 80 pushes the wedge members 30, 32 outward, as described above, applying force to the chassis 16. The spacer 82 limits the travel of the tightening element 34, which ensures that a controlled and precise force is applied to the wedge members 30, 32. This method is advantageous to control the torque applied to the tightening element 34, making installation simpler for the operator. Other configurations of a spring element 80 and/or a spacer 82 may be used.

The use of the spring element 80 allows for the card retainer device 10 to provide a precise/limited force without the need to monitor installation torque of the tightening element 34 which is a generally difficult and inaccurate measurement to make when not in a controlled laboratory environment. In addition, the torque applied to the tightening element 34 is a weak indicator of outward force, since the tightening element 34 may yield, friction coefficients may change and part wear will contribute to shifting force output over the life of the card retainer device 10.

Figure 6:
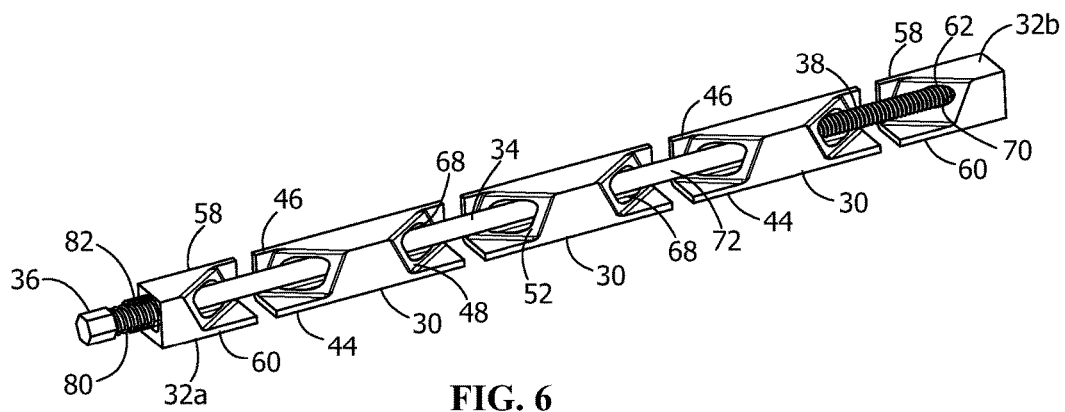
FIG. 6 is a perspective view of the card retainer device of FIG. 4, with various wedge members removed to shown the cooperation of the activation bolt with the wedge members.

The tightening element 34 is best shown in FIGS. 3 and 6. The tightening element 34 comprises a cylindrical shaft 72 which extends through the through holes 68, 70 formed within the wedge members 30, 32. For a better illustration of the end sections of the tightening element 34 the long cylindrical midsection has been omitted in the drawing. The forward end includes the engagement section 36 configured for manually turning the tightening element 34 and for projecting out of the wedge member 32b at the forward end thereof. The rear end of the shaft 72 provides a threaded section 38 configured for mating with the nut 40 (FIG. 2) disposed thereon. The range of the wedge members 30, 32 are aligned between the engagement section 36 and the nut 40. By rotating the engagement section 36 in relation to the threaded element in wedge member 32b, the distance between the engagement section 36 and the wedge member 32b can be shortened and the line of wedge members 30, 32 located in between can be compressed.

The tightening element 34 is just an example, and other compression means providing the desired result can be found. For example, spring members may be provided between the wedge members 32 and the tightening element 34 and/or the nut 40 for maintaining a compressive force. The nut 40, the engagement section 36 and/or the wedge members 32 may be shaped to positively couple same to prevent a relative rotational movement.

Figure 13:
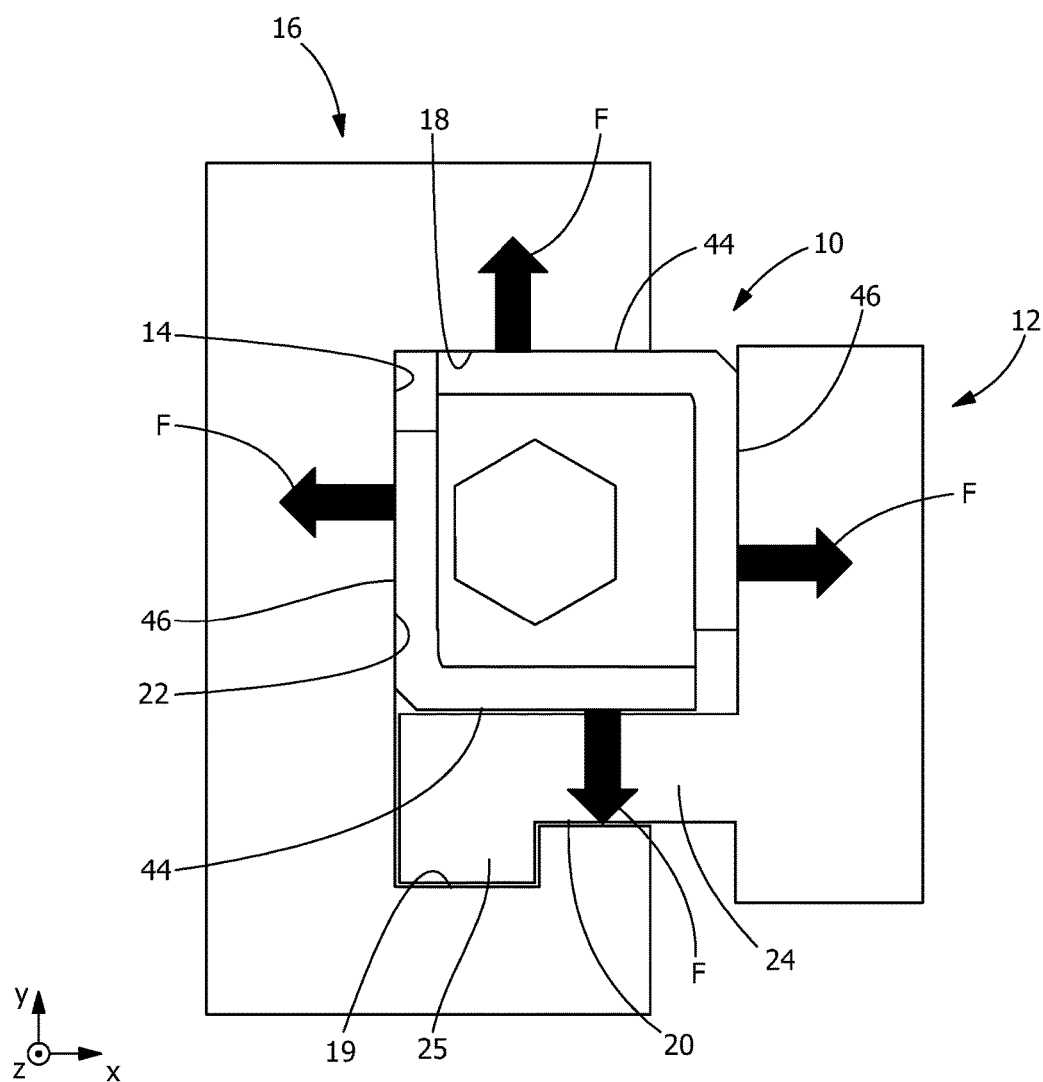
FIG. 13 is a schematic view of the card retainer device of FIG. 1 shown in engagement with an alternate chassis and alternate card module, illustrating the flow of heat and the force applied by the card retainer device.

Referring to FIG. 13, an alternate embodiment of the chassis 16 and card module 12 are shown. In this illustrative embodiment, flange 24 has a tab 25 which is received in a card guide slot or pocket 19 provided in side surface 18 proximate end surface 22 of the channel 14. When force is applied by the card retaining device 10 to the surfaces 18, 20, 22, the tab 25 engages the slot 19 generating a reaction force that limits the motion of the chassis 16 relative to the tab 25, thereby minimizing the deflection of the walls. With this deflection limiting feature, forces applied to the side wall 18 can equal the force applied to the card tab 25 or card guide slot 19. The use of the tab 25 and slot 19 facilitates the use of the card retainer device 10 in many applications or environments, including, but not limited to, military and aerospace electronics computing applications.

Figure 9:
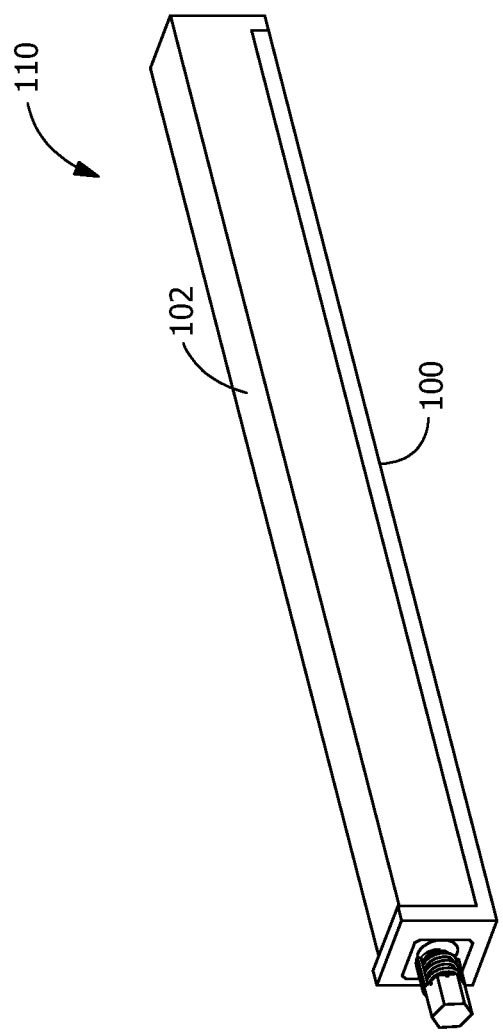
FIG. 9 is a perspective view of an illustrative fourth illustrative embodiment of a card retainer device of the present invention with wedge members housed in a bracket.
Figure 10:
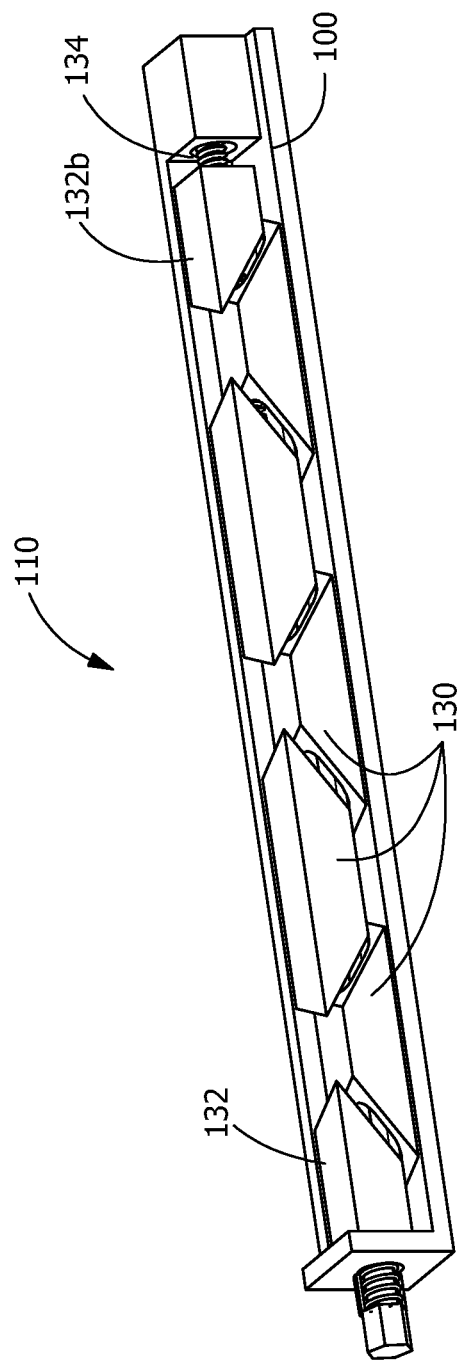
FIG. 10 is a perspective view of the card retainer device of FIG. 9, with a front plate removed to show the wedge members.

Referring to FIGS. 9 and 10, an embodiment of the card retainer device 110 is used with L-brackets 100, 102. The wedge members 130, 132 are made with a hollow profile, allowing a tightening element 134 to pass through the length of the assembly and engage a threaded end-wedge 132b. The bracket 100 contains openings to allow bolt pass-through, and for limiting the bolt travel, which prevents disassembly when the card retainer device 110 is relaxed. In the embodiment shown, the wedge members 130, 132 operate in the same manner as the wedge members 30, 32 described with respect to the embodiment shown in FIGS. 1 through 3. When actuated, in the manner previously described, the wedge members 130, 132 engage the L-brackets 100, 102, causing the L-brackets 100, 102 to apply force to the walls 18, 20, 22 of the channel 14 of the chassis 16 to maximize the total surface area for heat transfer.

In alternate embodiments, the wedge members can be hollow or solid. The L-brackets may both be movable or one of the brackets may be retained or fixed.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A card retainer device for securing a card module in a channel of a chassis, the card retainer device comprising:
   first wedge members which are positioned at the ends of the card retainer device, the first wedge members have first main portions with first integrated brackets integrally attached to the first main portions, the first integrated brackets form first L-shaped brackets which engage walls of the chassis, surfaces of the card module or a combination thereof;
   second wedge members which are positioned between, and slidably engage with, the first wedge members, the second wedge members have second main portions with second integrated brackets integrally attached to the second main portions, the second integrated brackets form second L-shaped brackets which engage walls of the chassis, surfaces of the card module or a combination thereof opposite those engaged by the first wedge members;
   wherein the first and second L-shaped brackets provide bearing surfaces which reduce binding and wear when the card retainer device secures the card module in the channel of a chassis and enhances the conductance of heat through the card retainer device.

2. The card retainer device as recited in claim 1, wherein each of the integrated brackets has a first engaging surface which extend in a direction essentially perpendicular to a second engaging surfaces.

3. The card retainer device as recited in claim 1, wherein each of the second wedge members has a central through hole which extends parallel to a longitudinal axis of the respective second wedge member, each of the through holes are configured to receive a tightening element therein, each of the through holes has a diameter which is larger than the diameter of the tightening element, thereby allowing for clearance for lateral movements of the second wedge members in directions which are perpendicular to a longitudinal axis of the tightening element.

4. The card retainer device as recited in claim 1, wherein each of the first wedge members has a central cylindrical through hole which extends parallel to a longitudinal axis of the respective first wedge member, each of the through holes are configured to receive a tightening element therein.

5. The card retainer device as recited in claim 4, wherein the tightening element is a bolt which extends through the length of the card retainer and engages a respective first wedge member located at an end of the card retainer device.

6. The card retainer device as recited in claim 4, wherein each of the through holes has a diameter which is larger than the diameter of the tightening element, thereby allowing for clearance for lateral movements of the first wedge members in directions which are perpendicular to a longitudinal axis of the tightening element.

7. The card retainer device as recited in claim 1, wherein a compressively loaded tightening element cooperates with a respective first wedge member to compress the first and second wedge members to cause lateral movements of the first and second wedge members in directions which are perpendicular to a longitudinal axis of the tightening element.

8. The card retainer device as recited in claim 1, wherein a tensile loaded tightening element cooperates with a respective first wedge members to compress the first and second wedge members to cause lateral movements of the first and second wedge members in directions which are perpendicular to a longitudinal axis of the tightening element.

9. The card retainer device as recited in claim 1, wherein a spring element and spacer are provided proximate a respective first wedge member, the spring element provides a compressive force and the spacer limits the travel distance of a tightening element, wherein the travel of the first and second wedge members is controlled and precise force is applied to the first and second wedge members by the tightening element.

10. The card retainer device as recited in claim 1, wherein the second main portions of the second wedge members have angled forward surfaces and angled rearward surfaces, the angled forward and rearward surfaces provide frictional gliding surfaces which allow for large friction force development.

11. The card retainer device as recited in claim 1, wherein the first main portions of the first wedge members have angled forward surfaces, the angled forward surfaces provide frictional gliding surfaces which allow for large friction force development.

12. A card retainer assembly comprising:
a chassis having a channel for receiving a card module and a card retainer device therein, the channel having a slot extending from a surface of the channel;
the card module having a flange which is received in the channel, the flange having a tab which is received in the slot;
the card retainer device having wedge members which exert force on the surfaces of the channels and the flange of the card module to retain the card module in the channel;
wherein when force is applied by the card retaining device to the surfaces of the channel and the flange, the tab engages the slot generating a reaction force that limits the motion of the chassis relative to the tab, thereby minimizing the deflection of the surfaces of the channel;
wherein first wedge members which are positioned at the ends of the card retainer device, the first wedge members have first main portions with first integrated brackets integrally attached to the first main portions, the first integrated brackets form first L-shaped brackets which engage walls of the chassis, surfaces of the card module or a combination thereof, second wedge members which are positioned between, and slidably engage with, the first wedge members; the second wedge members have second main portions with second integrated brackets integrally attached to the second main portions, the second integrated brackets form second L-shaped brackets which engage walls of the chassis, surfaces of the card module or a combination thereof, opposite those engaged by the first wedge members.

13. The card retainer assembly as recited in claim 12, wherein each of the wedge members has a central cylindrical through hole which extends parallel to a longitudinal axis of the respective wedge member, each of the through holes are configured to receive a tightening element therein, each of the through holes has a diameter which is larger than the diameter of the tightening element, thereby allowing for clearance for lateral movements of the wedge members in directions which are perpendicular to a longitudinal axis of the tightening element.

14. The card retainer assembly as recited in claim 12, wherein second wedge members have angled forward surfaces and angled rearward surfaces, the angled forward and rearward surfaces provide frictional gliding surfaces which allow for large friction force development.

15. The card retainer assembly as recited in claim 14, wherein first wedge members have angled forward surfaces, the angled forward surfaces provide frictional gliding surfaces which allow for large friction force development.

16. A card lock retainer assembly comprising wedge members with protrusions designed to produce heat transfer paths between a conduction card and a chassis wherein mating surfaces of mating wedge member interfaces have compound angles that produces an applied force orthogonal to a flange of the conduction card that is greater than 1/p the force applied parallel to the flange of the conduction card, where p is the friction factor between the mating surfaces of the mating wedge members within the card lock retainer assembly;
wherein first wedge members which are positioned at the ends of the card retainer device, the first wedge members have first main portions with first integrated brackets integrally attached to the first main portions, the first integrated brackets form first L-shaped brackets which engage walls of the chassis, surfaces of the card module or a combination thereof, second wedge members which are positioned between, and slidably engage with, the first wedge members; the second wedge members have second main portions with second integrated brackets integrally attached to the second main portions, the second integrated brackets form second L-shaped brackets which engage walls of the chassis, surfaces of the card module or a combination thereof, opposite those engaged by the first wedge members.

17. The card lock retainer assembly as recited in claim 16, wherein each of the wedge members has a central cylindrical through hole which extends parallel to a longitudinal axis of the respective wedge member, each of the through holes are configured to receive a tightening element therein, each of the through holes has a diameter which is larger than the diameter of the tightening element, thereby allowing for clearance for lateral movements of the wedge members in directions which are perpendicular to a longitudinal axis of the tightening element.

18. The card retainer device as recited in claim 16, wherein the wedge members are provided in an L-bracket.

* * * * *